(12) United States Patent
Too et al.

(10) Patent No.: US 7,256,065 B1
(45) Date of Patent: Aug. 14, 2007

(54) METHODS AND FIXTURE FOR COUPLING A LID TO A SUPPORT SUBSTRATE

(75) Inventors: Seah Sun Too, San Jose, CA (US); Edward Alcid, Sunnyvale, CA (US); Ahmad Juwanda, Bayan Lepas Penang (MY); Keng Sang Cha, Kumbar Penang (MY); Leang Hua Kam, Georgetown Penang (MY); Tek Seng Tan, Bayan Lepas Penang (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 429 days.

(21) Appl. No.: 10/859,673

(22) Filed: Jun. 3, 2004

(51) Int. Cl.
*H01L 21/00* (2006.01)
(52) U.S. Cl. ...................... 438/106; 438/118
(58) Field of Classification Search ............... 438/125, 438/106, 118
See application file for complete search history.

(56) References Cited

U.S. PATENT DOCUMENTS

| | | | |
|---|---|---|---|
| 5,907,474 A | 5/1999 | Dolbear | |
| 5,926,371 A | 7/1999 | Dolbear | |
| 6,136,128 A * | 10/2000 | Chung | 156/235 |
| 6,392,145 B1 | 5/2002 | Andric | |
| 6,504,243 B1 | 1/2003 | Andric et al. | |

* cited by examiner

*Primary Examiner*—Douglas M. Menz
(74) *Attorney, Agent, or Firm*—Farjami & Farjami LLP

(57) ABSTRACT

A method for coupling a lid to a support substrate having a semiconductor chip coupled thereto and a clamp fixture. Each semiconductor component has a semiconductor chip mounted to a semiconductor component and a lid coupled to the support substrate via a lid attach material. The lid attach material is cured either using a two-step process that includes a partial cure step followed by a clampless cure step or by curing the die attach material in a clamp fixture without including a pre-cure step. The semiconductor component manufacture decides on the curing approach based on cost and the number of semiconductor components being manufactured. If the semiconductor manufacturer opts for curing with a clamp fixture, the clamp fixture includes a base plate insert on which the semiconductor components are placed and a compression mechanism that includes a compression plate having a compressive material disposed thereon.

5 Claims, 3 Drawing Sheets

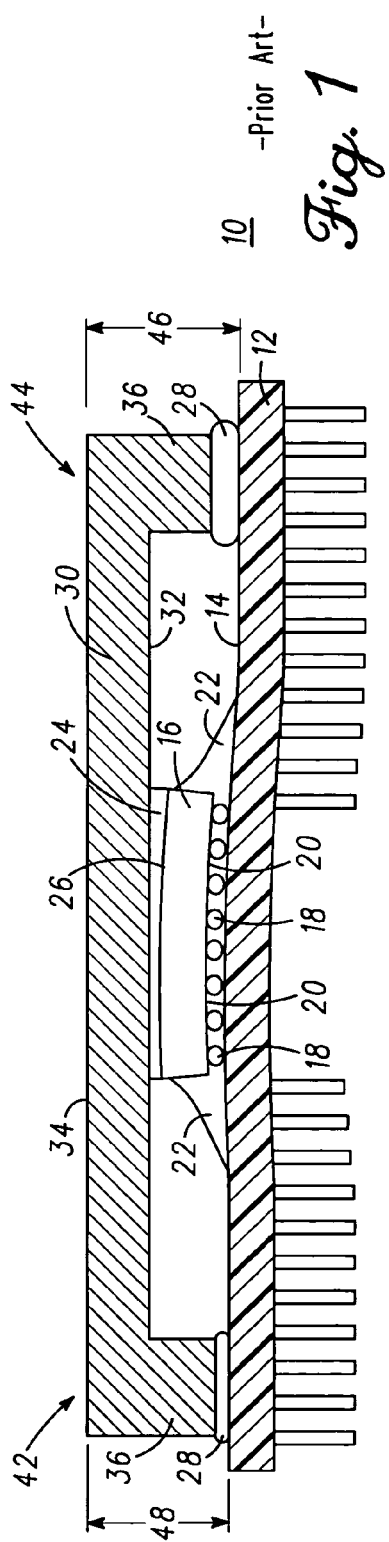
Fig. 1 —Prior Art—
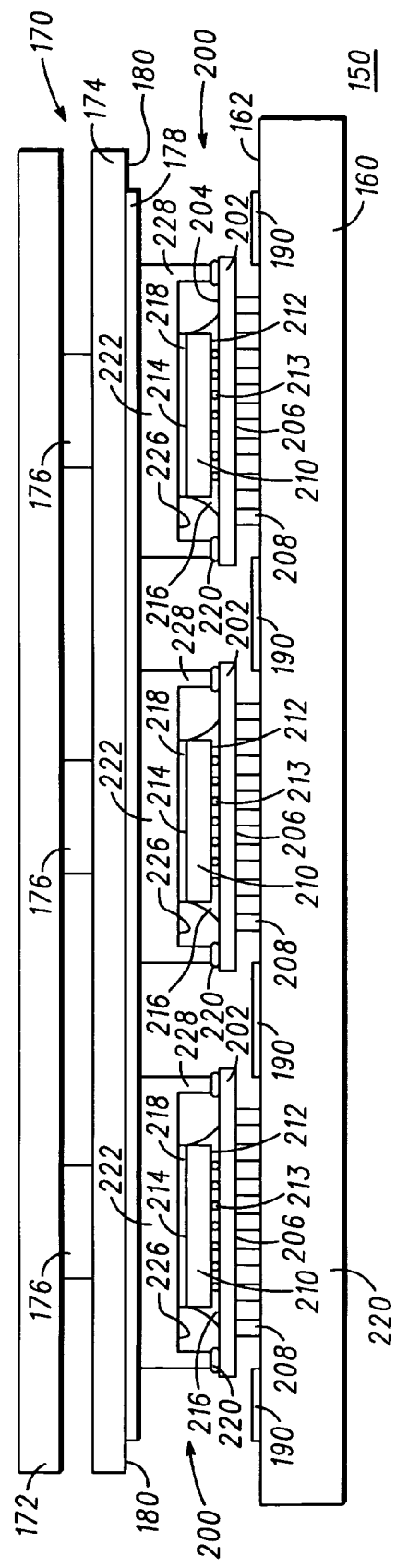
Fig. 5

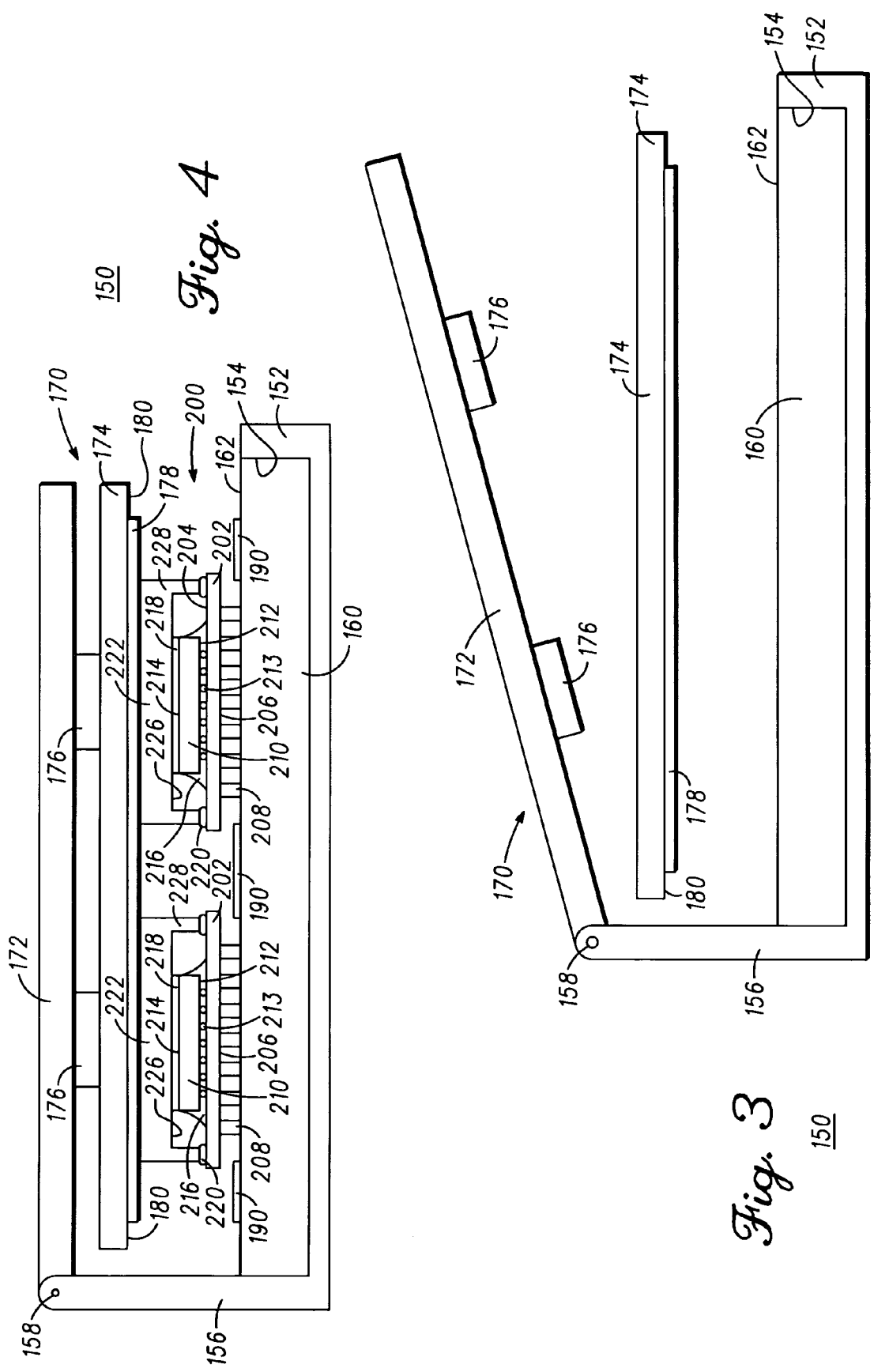

METHODS AND FIXTURE FOR COUPLING A LID TO A SUPPORT SUBSTRATE

FIELD OF THE INVENTION

This invention relates, in general, to semiconductor components and, more particularly, to semiconductor components having lids and methods and a fixture for attaching lids to support substrates.

BACKGROUND OF THE INVENTION

In the manufacture of semiconductor components, steps such as photolithography, etching, doping, and passivation are referred to as front-end processing steps, whereas steps such as dicing, substrate mounting, and encapsulation are referred to as back-end processing steps. Thus, the steps up to and including passivation are the front-end steps and the steps from dicing to completion of the semiconductor component are the back-end steps. After completion of the back-end steps, the semiconductor components are subjected to a power cycling test in which they are electrically stressed to detect any defective semiconductor components. One type of defect associated with the back-end steps is excessive lid tilt. FIG. 1 illustrates a semiconductor component 10 having excessive lid tilt. What is shown in FIG. 1 is a cross-sectional side view of a pin grid array (PGA) substrate 12 having a major surface 14 on which a semiconductor chip 16 is flip-chip mounted. Solder bumps 18 that are formed on a top surface 20 of semiconductor chip 16 are bonded to bond pads (not shown) disposed on major surface 14 of PGA substrate 12. After bonding, an underfill material 22 is dispensed between semiconductor chip 16 and major surface 14. A thermal interface material 24 is disposed on a back surface 26 of semiconductor chip 16 and a lid adhesive 28 is dispensed on major surface 14. A lid 30 having an inner surface 32, an outer surface 34, and a lip or support 36 is positioned in lid adhesive 28 to form semiconductor component 10.

Semiconductor component 10 is placed in a side-actuated or clamshell clamp fixture (not shown) which applies an asymmetric force on lid 30, i.e., the force applied to one side 42 of lid 30 is greater than the force applied to the other side 44 of lid 30. The clamp fixture housing PGA substrate 12, semiconductor chip 16, and lid 30 is placed in a curing oven to cure lid adhesive 28. A drawback of prior art clamp fixtures is that they cause lid tilt by applying an uneven force to lid 30. Often, the lid tilt exceeds specified tolerances. When the distance indicated by arrows 46 equals the distance indicated by arrows 48, the amount of lid tilt is zero. The amount of lid tilt is unacceptable when the distance indicated by arrows 46 exceeds the distance indicated by arrows 48 by more than a specified amount. Lid tilt becomes an even greater problem when the clamp fixture is adapted to accept multiple semiconductor components 10. One consequence of excessive lid tilt arises during power cycling of semiconductor component 10. During power cycling, semiconductor chip 16 generates heat which is transferred to PGA substrate 12, underfill material 22, and lid adhesive 28. Because PGA substrate 12, semiconductor chip 16, underfill material 22, and lid adhesive 28 have different coefficients of thermal expansion, the heat generated by semiconductor chip 16 causes movement between semiconductor chip 16 and lid 30. This movement squeezes out the thermal interface material 24 that is between semiconductor chip 16 and lid 30. The greater the amount of lid tilt, the greater the amount of thermal interface material 24 that is squeezed out from between semiconductor chip 16 and lid 30. The squeezing out of thermal interface material 24 decreases the amount of material between semiconductor chip 16 and lid 30, thereby increasing the thermal resistance between them. Thus, heat is not effectively removed from semiconductor chip 16 through lid 30 which may result in thermal failure of semiconductor chip 16.

Accordingly, what is needed are methods for manufacturing a semiconductor component that is capable of dissipating heat and a fixture for manufacturing the semiconductor component.

SUMMARY OF THE INVENTION

The present invention satisfies the foregoing need by providing a clamp fixture for use in coupling a lid to a support substrate and methods for manufacturing a semiconductor component. In accordance with one aspect, the present invention comprises a method for manufacturing a semiconductor component that includes providing a plurality of semiconductor components having a substantially uncured lid attach material. Each uncured semiconductor component comprises a support substrate having a semiconductor chip and a lid coupled to the support substrate by a lid attach material. Semiconductor component manufacturers select a processing technique in accordance with the number of semiconductor components having uncured lid attach material. If the number of semiconductor components with uncured lid attach material is greater than a predetermined value, the processing technique comprises partially curing the lid attach material followed by clamplessly curing the lid attach material. If the number semiconductor components with uncured lid attach material is less than the predetermined value, the processing technique comprises clamping the lid to the support substrate and curing the lid attach material while the lid is clamped to the support substrate.

In accordance with another aspect, the present invention comprises a method for manufacturing a semiconductor component that includes providing a support substrate. A semiconductor chip is mounted to the support substrate and a lid is coupled to the support substrate with a lid attach material, thereby forming a component assembly. The lid attach material is partially cured or pre-cured. Then the lid attach material is cured without the lid being clamped to the support substrate.

In accordance with yet another embodiment the present invention comprises a method for manufacturing a semiconductor component that includes providing a plurality of uncured semiconductor components, wherein each uncured semiconductor component comprises a support substrate having a semiconductor chip and a lid mounted thereto. The lid is coupled to the support substrate by a lid attach material that is uncured. The lid attach material is partially cured and then fully cured without the lid being clamped to the support substrate.

In accordance with yet another embodiment, the present invention includes a clamp fixture which comprises a support frame having a base plate insert receiving area and an extension. A base plate insert having a major surface is placed in the base plate insert receiving area. A hinge is mounted to the extension and a compression mechanism is coupled to the hinge. The compression mechanism comprises an actuator plate having an elastic coupling mechanism mounted thereto. The compression mechanism also includes a compression plate on which a compressive material is disposed. When clamping a lid to a support substrate, the elastic coupling mechanism urges the compression plate towards the lid.

BRIEF DESCRIPTION OF THE DRAWINGS

The present invention will be better understood from a reading of the following detailed description, taken in conjunction with the accompanying drawing figures, in which like reference numbers designate like elements and in which:

FIG. 1 is a cross-sectional side view of a prior art lidded semiconductor component;

FIG. 3 is a side view of a portion of a fixture for clamping a lid to a support substrate in accordance with an embodiment of the present invention, wherein the fixture is in an open configuration;

FIG. 4 is a cross-sectional side view of a support substrate having a lid mounted thereon and a lidded support substrate positioned in the clamp fixture of FIG. 3 in accordance with an embodiment of the present invention; and FIG. 5 is a cross-sectional front view of the lidded support substrate and clamp fixture of FIG. 4.

DETAILED DESCRIPTION

Figure 2:
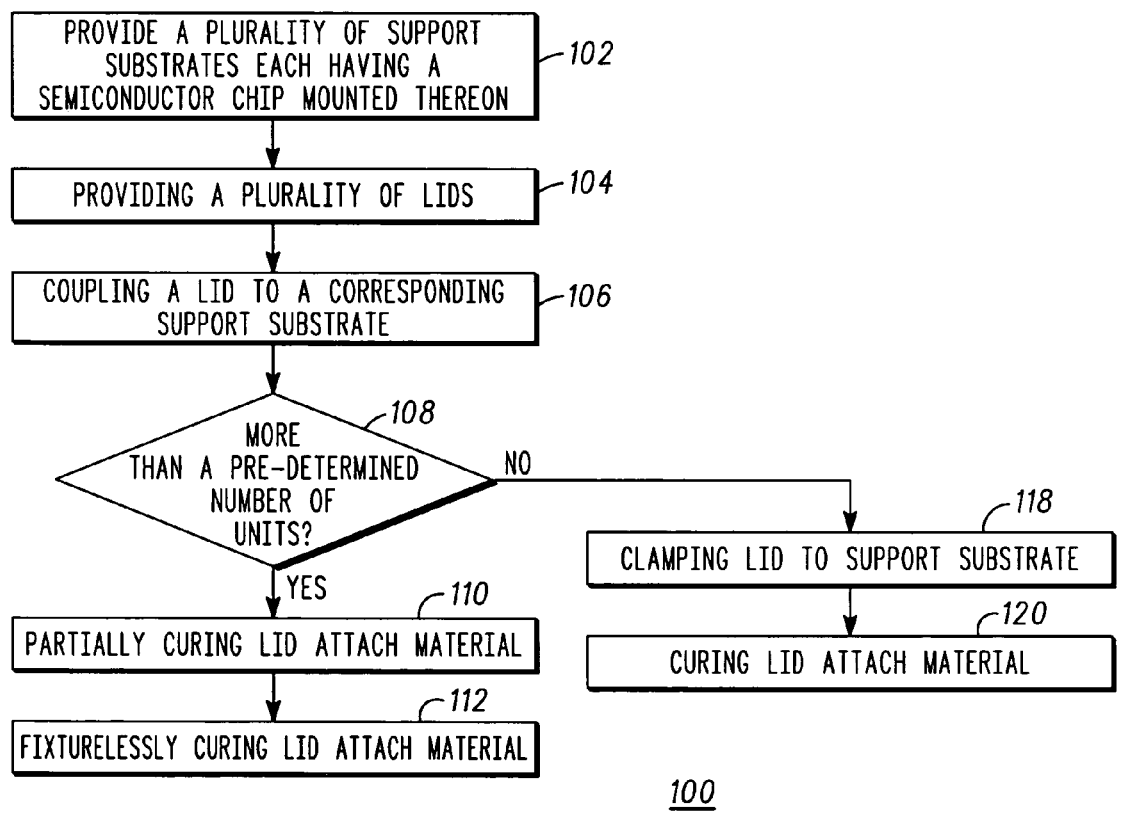
FIG. 2 is a flow chart of a method for manufacturing a semiconductor component in accordance with an embodiment of the present invention.

Generally, the present invention provides methods and a fixture for coupling a lid to a support substrate on which a semiconductor chip is mounted. In accordance with an embodiment of the present invention, a decision point occurs in the manufacturing process where the semiconductor manufacturer decides or selects a technique for curing the lid attach material. The decision is based on the cost of curing the adhesive material used for securing a lid to a support substrate. In high volume production operations, the cost of curing the lid attach material by placing the semiconductor component in a clamping fixture, placing the clamping fixture in a curing oven, and then curing the lid attach material is very high because of the number of clamping fixtures used in the curing process. In accordance with the present invention, the cost can be lowered by automating the curing process and eliminating the need for clamp fixtures. But, in low volume production operations, the cost of manually curing the lid attach material using a clamp fixture is lower than the cost of automating the lid attach step. In accordance with the present invention, the semiconductor component manufacturer selects between a fixtureless partial cure process and a full cure process in a clamp fixture. In the high volume approach, the semiconductor manufacturer partially cures the lid attach material, then cures the lid attach material without using a clamping fixture. In the low volume approach, the semiconductor manufacturer clamps a lid to a support substrate and places the clamping fixture and semiconductor component in the curing oven to cure the lid attach material.

In accordance with another aspect, the present invention provides a hinged or clamshell clamp fixture. The hinge is mounted to an arm or extension such that closing the clamp fixture applies a substantially uniform pressure to the lids of the semiconductor components. In addition, the clamp fixture includes a hardened tool steel insert upon which the semiconductor components rest during the curing process in which the semiconductor components are cured in a clamp fixture. The clamp fixture has a compression mechanism that includes an actuator plate having an elastic coupling means coupled thereto. The clamp fixture also includes a compression plate. Preferably, the compression plate is a stainless steel plate having a surface on which a compressive material is disposed. The configuration of the clamp fixture creates a substantially uniform pressure on the lids of the semiconductor components during a clamped curing process.

FIG. 2 is a flow diagram 100 of a method for manufacturing a semiconductor component in accordance with an embodiment of the present invention. In a beginning step (indicated by box 102), a plurality of support substrates are provided, wherein a semiconductor chip is mounted to each support substrate. Preferably, each semiconductor chip is flip-chip mounted to an associated support substrate. Additionally, a plurality of lids are provided (indicated by box 104). Each lid is coupled to the associated support substrate by disposing a lid attach material on the support substrate and placing the lid in the lid attach material (indicated by box 106). Typically, a thermal interface material is formed on the back side of the semiconductor chip before placing the lid in the lid attach material. The thermal interface material allows the lid to be in thermal communication with the semiconductor chip. The combination of a support substrate having a semiconductor chip and a lid mounted thereto is referred to as an assembly or a unit.

At a step indicated by decision diamond 108, the semiconductor component manufacturer decides to cure the lid attach material using either a partial cure process with a fixtureless curing step or a clamped full cure process without a partial cure step. The partial cure process is also called a pre-cure process. If the number of units is greater than a pre-determined value, the partial cure process with a fixtureless curing technique is used. If the number of units is less than the predetermined value, the partial cure technique is not used. Rather the lid attach material is cured using a full cure process in a clamp fixture. The partial cure technique is useful for high volume production runs, i.e., when curing more than about 200,000 units per week, whereas the clamped full cure process without a pre-cure step is useful for low volume production runs, e.g., when curing less than about 200,000 units per week. The semiconductor component manufacturer selects the pre-determined value, e.g., 200,000 units per week. It should be noted that the number of units manufactured in a high volume production run may be greater than or equal to the predetermined value. In this case, the number of units manufactured in a low volume production run would be less than the predetermined value. Alternatively, the number of units manufactured in a high volume production run may be greater than the predetermined value. In this case, the number of units manufactured in a low volume production run would be less than or equal to the predetermined value. In other words, the pre-determined value may be included in either the high volume production run or the low volume production run.

A semiconductor component manufacturer operating in a high volume production scheme partially cures the lid attach material by evenly applying pressure to the lids for a sufficient amount of time to allow the lid attach material to set (indicated by box 110). Advantages of partially curing the lid attach material include improving adhesion strength, minimizing lid tilt between the lid and the support substrate, formation of a thermal interface material having a desirable bond line thickness, and prevention of lid movement. Optionally, the units can be heated while pressure is being evenly applied to the lids. For a lid attach material such as, for example, a silicone-based adhesive or an epoxy-based adhesive, the units are subjected to the heat and pressure for a time period ranging from about 60 seconds to about 30 minutes. After partially curing the lid attach material, the applied pressure is removed and they are fully cured in a curing oven without being clamped in a clamp fixture (indicated by box 112). When the lid attach material is a silicone-based adhesive, the partially cured units are cured for a time period ranging from about 30 minutes to about 120 minutes at a temperature ranging from about 100 degrees Celsius (° C.) to about 180° C. Because the partial cure process involves curing the lid attach material without using a fixture, it is also referred to as fixturelessly or clamplessly curing the lid attach material.

If the semiconductor component manufacturer is operating in a low volume production scheme, the units are placed in a clamp fixture such as clamp fixture 150 shown in FIGS. 3-5 (indicated by box 118). The clamp fixture is closed, i.e., the lids are clamped to the support substrates, and the clamp fixture is placed in the curing oven. The clamped units are cured for a time period ranging from about 30 minutes to about 120 minutes at a temperature ranging from about 100 degrees ° C. to about 180° C. (indicated by box 120).

FIG. 3 is side view of a clamp fixture 150 in an open configuration in accordance with an embodiment of the present invention. Clamp fixture 150 is also referred to as a lid attachment fixture. What is shown in FIG. 3 is a support frame 152 having a base plate insert cavity 154 and a hinge attachment mechanism or extension 156. A hinge 158 is coupled to hinge attachment mechanism 156 to form an elevated hinge mechanism. Elevating the hinge mitigates and may prevent non-parallelism between the lid and the support substrate. A base plate insert 160 having a surface 162 is placed in base plate insert cavity 154. Preferably, base plate insert 160 is hardened tool steel because it is resistant to scratching and because contaminants do not adhere to the hardened tool steel. For example, when semiconductor components 150 are pin grid array components, the pins of the pin grid array do not scratch surface 162 and they do not pick up contaminants from surface 162.

A compression mechanism 170 is coupled to hinge 158. Compression mechanism 170 comprises an actuator plate 172 to which an elastic means 176 is mounted. Elastic means 176 may be, for example, coined springs, leaf springs, elastic materials such as silicone rubber, or the like. Compression mechanism 170 further includes a compression plate 174 having a contact surface 180. To further increase the elasticity of compression mechanism 170, an elastic material 178 is disposed on a contact surface 180 of compression plate 174. By way of example, elastic material 178 is silicone rubber. Preferably, compression plate 174 is not connected to actuator plate 172 but it cooperates with actuator plate 172 when clamping the lids of a semiconductor component to a support substrate. In operation, the units are placed on base plate insert 160 and compression plate 174 is placed on the lids of the units. The clamping operation is further described with reference to FIGS. 4 and 5.

Preferably, actuator plate 172 and compression plate 174 are rectangularly shaped aluminum plates. It should be understood that the material and shapes of actuator plate 172 and compression plate 174 are not limitations of the present invention. Other suitable shapes for plates 172 and 174 include square, circular, triangular, pentagonal, hexagonal, etc. Other suitable materials for plates 172 and 174 includes stainless steel or the like.

Referring now to FIG. 4, a side view of clamp fixture 150 in a closed configuration is shown. FIG. 4 further illustrates a carrier or boat 190 containing a plurality semiconductor components 200 located in clamp fixture 150. Clamp fixture 150 has a carrier guide or alignment feature (not shown) adapted for receiving carrier 190 so that semiconductor components 200 are correctly positioned on base plate insert 160. This positioning causes pins 208 to rest on surface 162 of base plate insert 160. By way of example, semiconductor components 200 include pin grid array (PGA) structures 202 having a chip or die receiving surface 204 and a pin extension surface 206. It should be understood the present invention is not limited to pin grid array structures but may include, for example, ball grid array (BGA) structures, land grid array (LGA) structures, ceramic packages, plastic packages, or the like. Pins 208 extend from pin extension surface 206. A semiconductor die or chip 210 having a bumped surface 212 and a back surface 214 is flip-chip mounted to a chip receiving area on die receiving surface 204. Bumped surface 212 has a plurality of solder balls 213 coupled thereto. An underfill material 216 is dispensed between semiconductor chip 210 and chip receiving surface 204. A thermal interface material 218 is disposed on back surface 214. The coefficient of thermal expansion of semiconductor chips 210 is such that they are non-planar or warped at room temperature. Thermal interface material 218 helps to compensate for the surface warpage across surface 214 of semiconductor die 210. Preferably, thermal interface material 218 is a thermally conductive material such as, for example, a thermal grease, a thermal phase change material, or a thermal gel. A lid adhesive material 220 is disposed on each die receiving surface 204 such that it surrounds semiconductor chips 210. Lids or caps 222, each having an outer surface 224, an inner surface 226, and a lip or support 228, are placed in lid attach material 220, thereby bonding lids 222 to PGA substrates 202. Suitable materials for lid 222 include copper, aluminum, aluminum silicon carbide, or the like. Lids 222 protect semiconductor chips 210 from physical and environmental stresses.

Semiconductor components 200 are placed in carrier 190. Then, carrier 190 containing semiconductor components 200 is positioned in clamp fixture 150 using the carrier guides (not shown). Compression plate 174 is placed on lids 222 such that elastic material 178 rests on surfaces 224 of lids 222. Actuator plate 172 is rotated about hinge attachment mechanism 156 using hinge 158 until elastic means 176 contacts compression plate 174. The combined weight of actuator plate 172 and compression plate 174 presses lids 222 into lid attach material 220. Elastic material 178 absorbs lid tilt or height variations. In addition, elastic means 176 also compensates for lid tilt or height variations so that a substantially uniform force or pressure is applied to semiconductor components 200.

FIG. 5 illustrates a front view of clamp fixture 150 in a closed configuration containing a plurality of semiconductor components 200.

Clamp fixture 150 containing semiconductor components 200 is placed in a curing oven (not shown) to cure lid attach material 220. Curing causes lid attach material 220 to transition to a solid state. Because surfaces 224 of lids 222 have an even pressure applied against them during the curing process, surfaces 212 and 224 remain substantially parallel to each other after curing, i.e., lid tilt is kept to less than about seventy micrometers.

After curing, semiconductor components 200 undergo a power cycling process that heats and cools semiconductor components 200. During power cycling, as semiconductor chips 210 are heated and cooled, PGA substrate 202, cured underfill material 216, cured lid attach material 220, lids 222, and semiconductor chips 210 expand and contract at different rates because they have different coefficients of thermal expansion. Suitable materials for thermal interface material include thermal grease, thermal gel, a phase change material, or the like. Because the tilt of lid 222 is maintained at less than about seventy micrometers, the amount of thermal interface material that is squeezed out is insufficient to significantly increase the thermal resistance between semiconductor chips 210 and lids 222. The thermal interface material between semiconductor chips 210 and lids 222 permits dissipation of the heat from semiconductor chips 210. Thus, a low thermal resistance at the interface between semiconductor chips 210 and lids 222 allows a substantial amount of heat to be dissipated from semiconductor chips 210.

By now it should be appreciated that a clamp or lid attachment fixture for attaching a lid to a support structure and methods for attaching the lid to the support substrate have been provided. In accordance with the present invention, a decision point is reached at which the semiconductor component manufacturer decides whether to use a partial cure step followed by a clampless cure step or whether to clamp the lid to the support substrate and cure the lid attach material with the lid clamped to the support substrate. The decision is based on a combination of factors including cost and production volume. The technique that includes partial curing lends itself to automation. However, automating the curing steps can be expensive unless the production volumes are sufficiently high to justify the cost. When the production volumes are low, it may be more cost effective to use clamp fixture 150 rather than incurring the cost of automating the process. Providing the semiconductor manufacturer the ability to select between clamped and unclamped curing steps allows the semiconductor component manufacturer to select the most cost efficient process for manufacturing its components.

Another advantage of using a partial cure step is that it increases the capacity or the number of semiconductor components whose lid attach material can be cured because it reduces the number of clamp fixtures used or eliminates their use altogether during curing.

Another advantage of the clamp fixture is that offsetting the hinge and including a compression mechanism improves parallelism, i.e., ensures the lid and substrate surface remain substantially parallel.

Although certain preferred embodiments and methods have been disclosed herein, it will be apparent from the foregoing disclosure to those skilled in the art that variations and modifications of such embodiments and methods may be made without departing from the spirit and scope of the invention.

What is claimed is:

1. A method for manufacturing a semiconductor component, comprising:

providing a plurality of uncured semiconductor components, wherein each uncured semiconductor component comprises a support substrate having a semiconductor chip and a lid mounted thereto, wherein the lid is coupled to the support substrate by an uncured lid attach material;

partially curing the lid attach material, wherein pressure is applied to the lid; and fixturelessly curing the lid attach material, wherein the pressure is not applied to the lid.

2. The method of claim 1, wherein partially curing the lid attach material includes heating the lid attach material to a temperature ranging from about 100 degrees Celsius (° C.) to about 180° C.

3. The method of claim 1, wherein partially curing the lid attach material includes partially curing the lid attach material for a time period ranging from about 60 seconds to about 30 minutes.

4. The method of claim 1, wherein clamplessly curing the lid attach material includes placing the semiconductor component in a curing oven for a time period ranging from about 30 minutes to about 120 minutes.

5. The method of claim 4, wherein the curing oven is set to a temperature ranging from about 100 degrees Celsius (° C.) to about 180 (° C.).

* * * * *